United States Patent [19]

Gentsch et al.

[11] Patent Number: 5,294,885
[45] Date of Patent: Mar. 15, 1994

[54] RESONATOR FOR ELECTRON SPIN RESONANCE SPECTROSCOPY

[75] Inventors: Ekkehard Gentsch, Karlsruhe; Dieter Schmalbein, Marxzell-Burbach, both of Fed. Rep. of Germany

[73] Assignee: Bruker Analytische Messtechnik GmbH, Fed. Rep. of Germany

[21] Appl. No.: 847,491

[22] Filed: Mar. 6, 1992

[30] Foreign Application Priority Data

Mar. 9, 1991 [DE] Fed. Rep. of Germany ....... 4107631

[51] Int. Cl.$^5$ .......................................... G01R 33/20
[52] U.S. Cl. ..................................... 324/316; 324/318
[58] Field of Search .............. 324/300, 307, 316, 318, 324/322

[56] References Cited

U.S. PATENT DOCUMENTS

| 4,314,204 | 2/1982 | Biehl et al. | 324/316 |
| 4,360,776 | 11/1982 | Bauman | 324/316 |
| 4,399,406 | 8/1983 | Biehl et al. | 324/316 |
| 5,142,232 | 8/1992 | Konishi et al. | 324/316 |

*Primary Examiner*—Michael J. Tokar
*Attorney, Agent, or Firm*—Claude A. S. Hamrick

[57] ABSTRACT

A resonator is provided for electron spin resonance spectroscopy. The resonator comprises a first wall element which delimits a cavity and which is in releasable contact with other wall element delimiting the cavity. The connection between the first wall element and at least one of the additional wall elements is effected only by spring force (single figure).

3 Claims, 1 Drawing Sheet

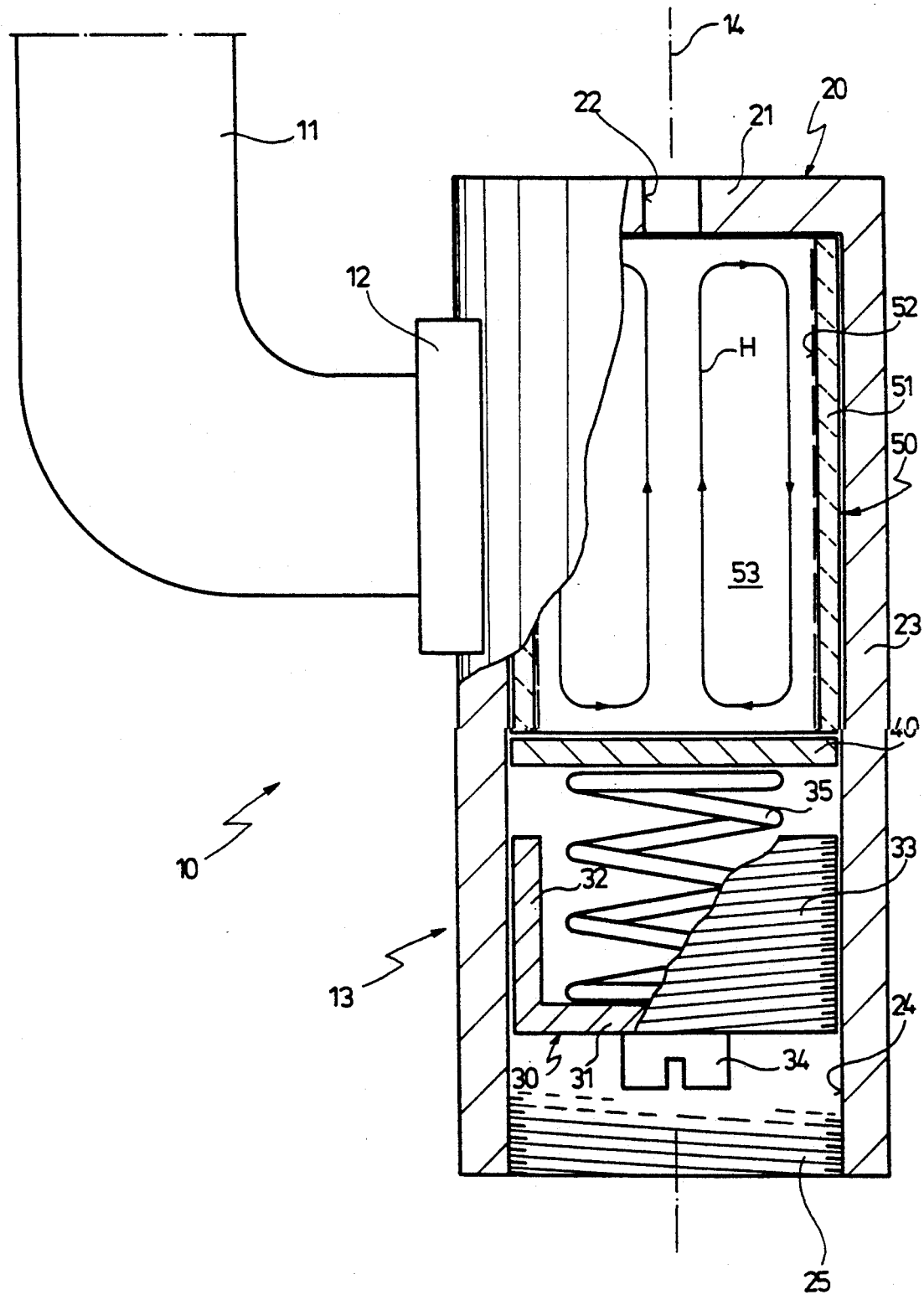

RESONATOR FOR ELECTRON SPIN RESONANCE SPECTROSCOPY

The present invention relates to a resonator for electron spin resonance spectroscopy having a first wall element which delimits a cavity and which is in releasable contact with other wall element delimiting the cavity.

A resonator of the before-described type is generally known.

In electron spin resonance spectroscopy, resonators are being used in which a predetermined oscillation of an electromagnetic wave in the microwave range is capable of propagating. Usually, the shape of the cavity of such a resonator is either cylindrical or cuboid.

Known types of construction of such resonators have a multi-piece design. In the case of cylindrical resonators it has been known, for example, to provide one or both ends of a tubular body with a screw-in element in order to define a cylindrical cavity inside the tubular body.

Further, there have been known cuboid cavity resonators where a solid element consisting of a conductive material, for example a brass element of a predetermined thickness, is provided with a rectangular passage opening, and this rectangular passage opening is covered with screw-on walls on both sides so that the enclosed space has a cuboid shape.

It has further been known in connection with these resonators to generate a modulation field inside the cavity. This latter term is used to describe a magnetic alternating field of an amplitude of some 10 G and a frequency of up to 100 KHz. The modulation field serves to modulate the constant magnetic field required for electron spin resonance measurements about the resonance point in order to permit low-frequency processing of the measurement signal, for example by means of lock-in amplifiers.

The modulation frequency being in the KHz range, one cannot give the resonator any wall thickness desired, as otherwise it would have a screening effect relative to the modulation field.

It has been known for this reason to provide resonators with suitable slots to enable the modulation field to enter the cavity. However, this solution is connected with certain disadvantages because the slots always produce an interfering effect on the microwave field, even if they are arranged in parallel to the wall current in the cavity resonator.

It has also been known to design resonators, at least in part, in such a way that the wall elements delimiting the cavity are made from an electrically non-conductive material and are provided on their inside facing the cavity with a conductive coating applied, for example, by vaporization, electroplating, or the like.

So, it has been known for example in connection with rectangular resonators of the type described further above, to design the walls, which are screwed to the sides of the solid component, as ceramic plates which have their inwardly directed faces provided with a metallic coating.

Similarly, it is possible in the case of a cylindrical resonator to make use of a ceramic tube or a glass tube provided with a metallic coating on its inside, or on its outside, and to screw conductive bottom plates, for example metal plates to both ends of such a tube.

However, resonators of this kind may cause problems under certain conditions.

If, for example, such a resonator is used for measurements where the sample and, thus, the resonator itself are exposed to temperatures varying within broad limits, then the components of the resonator are subjected to considerable thermal variations in length, as a result of their coefficient of thermal expansion. Electron spin resonance measurements are carried out, for example, near the absolute zero of temperature (for example at 4° K.), but on the other hand also at temperatures far above room temperature (500° K.). As in such cases it is frequently desired that the sample should remain in the measuring arrangement while the temperature is varied over the full before-mentioned temperature range between 4° to 500° K., considerable problems may result under certain conditions. In the case of screw-connected ceramic or glass components of the type described further above, the expansion resulting from different temperature coefficients may strain these components excessively so that eventually they may break.

The same applies by analogy to other connection techniques, for example to connections by means of adhesives, by soldering, or the like, which produce a rigid connection between the wall elements defining the cavity.

Now, it is the object of the present invention to improved a resonator of the before-described kind in such a way that it can be used within broad temperature ranges without the wall elements delimiting the cavity being overloaded mechanically, due to thermal variations in length.

The invention achieves this object by the fact that the connection between the first wall element and at least one of the additional wall elements is effected only by spring force.

This solves the problem underlying the present invention fully and perfectly.

For example, it is possible in this way with relatively simple means to predetermine the spring force in such a way that on the one hand the pressing force will be sufficient to guarantee stable mechanical and, thus, electric conditions in the cavity, and on the other hand to adjust the pressing force to a value low enough to prevent any overloading of the wall elements, and this even when the latter consist of a relatively brittle material, such as glass or a ceramic material.

The force connecting the one wall element with the other wall elements being determined only by the force of the spring, it will not change if the components expand or contract due to thermal variations. In any case, however, the variations in length encountered in the temperature ranges of interest for the present purposes are so small that the resulting variation of the spring force, determined by the elasticity constant of the spring, will be so extremely small that they can be neglected for the present purposes.

According to a preferred embodiment of the invention, the one wall element is a bottom plate which is urged against another wall element in the form of a tube.

This feature provides the advantage that it permits the use of resonator configurations where the wall currents flow around the tubular wall element whereas no such wall currents are encountered in the transitional area between the tube and the bottom plate. As a consequence, the RF field in the resonator is influenced only minimally.

According to a preferred further development of this variant, the bottom plate and the tube are urged jointly against an end wall.

This feature provides the advantage that the tube as such is retained loosely, i.e. is not clamped or screwed rigidly to other components, so that the tube can be made from a brittle material, such as a ceramic material or glass.

According to one constructional implementation of this variant, the end wall is the bottom of a cup-shaped element receiving the tube, the bottom plate and a spring which bears by its one end against the bottom plate and by its other end against an insert fitted in an opening in the cup-shaped element.

This feature provides the advantage that it results in an extremely compact and in addition space-saving design because the arrangement can be selected in such a way that the axis of the tube and the spring extends perpendicularly to the direction of the constant magnetic field so that the greatest extension in length of the resonator is in a direction perpendicular to the critical air gap width between the pole shoes of a magnet.

Although the invention is not limited to this use, it is employed with particular preference for resonators having a cylindrical cavity in which an oscillation mode of the type $TE_{01n}$, for example, is excited.

Other advantages of the invention will appear from the specification and the attached drawing.

It is understood that the features that have been described before and will be explained hereafter may be used not only in the described combinations, but also in any other combination, or individually, without leaving the scope and intent of the present invention.

One embodiment of the invention will now be described in more detail with reference to the drawing in which the single FIGURE shows a—partly sectional—side view of one embodiment of a resonator according to the invention.

In the drawing, reference numeral 10 indicates a resonator of the cylindrical type in which an oscillation mode of the type $TE_{011}$ is excited, as indicated by field lines H.

The resonator 10 is coupled via a waveguide 11 which is applied radially to the resonator 10, via a 90° bend, and which generally extends in the direction of a longitudinal axis 14. The waveguide 11 is connected to the resonant element 13 of the resonator 10 via a coupling flange 12 in a manner known as such.

Here again, it goes without saying that the coupling arrangement of the resonator 10 using a waveguide 11 is to be understood as an example only and that the resonator 10 may of course be coupled in the conventional manner at any other point. Also, the coupling elements have not been illustrated in detail, being known to any man skilled in the art in the form of antennas, iris diaphragms, or the like.

The resonant element 13 comprises a cup-shaped element 20 which is open at the bottom, as viewed in the FIGURE. Consequently, the cup-shaped element 20 has an upper end wall 21 which is fully closed, except for a central sample opening 22 which is aligned with the longitudinal axis 14.

The cup-shaped element 20 comprises further a cylindrical jacket 23 which ends at the bottom by an opening 24 which is provided with an internal thread 25, preferably a fine thread.

Fitted in the opening 24 is a screw-in element 30, which likewise exhibits a cup-like shape, but has its opening turned up. The screw-in element 30, therefore, has a bottom 31 and a cylindrical wall 32. The cylindrical wall 32 is provided with an outer thread 33, preferably also a fine thread, which coacts with the internal thread 25 in the opening 24.

A screwing flange 34 fitted on the lower face of the bottom 31 enables the screw-in element 30 to be screwed in or out using a suitable tool, for example a screwdriver.

The space defined by the cylindrical wall 32 accommodates a spiral spring 35 which is supported on the bottom 31. The spiral spring 35 consists, preferably, of copper beryllium, an alloy which remains sufficiently elastic even at very low temperatures near absolute zero.

The upper end of the spiral spring 35 bears upon a bottom plate 40 of circular shape. The bottom plate 40 in its turn carries a tube 50 consisting essentially of a hollow-cylindrical ceramic or glass body 51 and a conductive coating 52. The coating 52, preferably, is applied to the inside of the ceramic body 51, but may also be provided on its outside.

The operation and effect of the resonator 10 is as follows:

During initial assembly of the resonator 10, the tube 50 is at first introduced into the empty cup-shaped element 20. Thereafter, the bottom plate 40 is placed on the lower end of the tube 50, as viewed in the FIGURE. One now screws the screwing element 30, in which the spiral spring 35 has been fitted during the feeding motion, into the opening 24 of the cup-shaped element from below.

By screwing the screw-in element 30 in a defined distance, the spiral spring is compressed so that the bottom plate 40, together with the tube 50, is urged from the inside, or from the bottom, as viewed in the drawing, against the upper end wall 21 of the cup-shaped element 20.

Now, a predetermined axial pressing force can be generated with the aid of suitable markings, or the like. The pressing force is selected in such a way that the bottom plate 40, the tube and the upper end wall 21 are connected firmly enough to provide a cavity 53 with a conductive surface and minimum contact resistance between the individual elements.

By coupling an electromagnetic wave via the waveguide 11, it is now possible to generate the desired oscillation mode in the cavity 53.

If the resonator 10 is now exposed to very different or heavily varying temperatures, this has practically no influence on the pressing force exerted by the spiral spring 35, since the dimensions of the spiral spring 35 and the elements holding it will change only very little so that, consequently, only very small variations of the pressing force will occur as a result of the spring constant of the spiral spring 35. Consequently, the compression force holding the bottom plate 40, the tube 50 and the upper end wall 21 together will practically remain unchanged, regardless of the temperature prevailing at any time.

Although the invention has been described by way of the above embodiment, which is based on a cylindrical resonator, it goes without saying that these explanations apply by analogy if the invention is used in connection with a rectangular resonator where rectangular boundary walls, for example, are urged into contact with other boundary wall elements by means of springs.

What is claimed is:

1. A resonator for electron spin resonance spectroscopy, comprising:
    a cup-shaped element having a cylindrical wall with a bottom at one end thereof and first threads formed on said wall proximate an opposite end thereof;
    a tube having openings at both ends and being received within said cup-shaped element, said tube being provided with a conductive coating, a first of said openings of said tube adjoining said cup-shaped element bottom;
    a plate received within said cup-shaped element and adjoining a second of said openings of said tube opposite said cup-shaped element bottom;
    an insert fitted into said cup-shaped element opposite end and having second threads mating with said first threads; and
    a spring means arranged between said insert and said plate for urging said plate and said tube against said cup-shaped element bottom.

2. The resonator of claim 1, wherein said tube is made of a ceramic material.

3. The resonator of claim 1, wherein said tube is made of glass.